United States Patent [19]

Ito et al.

[11] Patent Number: 5,274,280
[45] Date of Patent: Dec. 28, 1993

[54] SEMICONDUCTOR INTEGRATED CIRCUIT DEVICE HAVING SEPARATE SUPPLY VOLTAGES FOR THE LOGIC STAGE AND OUTPUT STAGE

[75] Inventors: Yuko Ito, Ohme; Toshio Yamada, Hamura; Atsushi Shimizu, Ohme; Kazuo Tanaka, Hamura; Sukehiro Yoshida, Ohme, all of Japan

[73] Assignees: Hitachi, Ltd., Tokyo; Hitachi Computer Engineering Co., Ltd., Hadano, both of Japan

[21] Appl. No.: 759,428

[22] Filed: Sep. 13, 1991

[30] Foreign Application Priority Data

Sep. 21, 1990 [JP] Japan ................. 2-253637

[51] Int. Cl.⁵ .................. H03K 19/086; H03K 17/16
[52] U.S. Cl. .................. 307/455; 307/443; 307/296.1
[58] Field of Search .......... 307/443, 455, 296.1, 307/303.1; 357/45, 44

[56] References Cited

U.S. PATENT DOCUMENTS

| | | | |
|---|---|---|---|
| 3,808,475 | 4/1974 | Buelow et al. | 357/45 |
| 4,656,370 | 4/1987 | Kanuma | 307/443 |
| 4,857,765 | 9/1989 | Cahill et al. | 307/443 |
| 4,883,978 | 11/1989 | Ohshima et al. | 307/443 |
| 4,989,062 | 1/1991 | Takahashi et al. | 357/45 |
| 5,025,179 | 6/1991 | Freitas | 307/455 |
| 5,083,181 | 1/1992 | Yoshida et al. | 357/45 |

FOREIGN PATENT DOCUMENTS

| | | | |
|---|---|---|---|
| 0264737 | 11/1986 | Japan | 357/45 |
| 0001244 | 1/1987 | Japan | 357/45 |
| 1-280348 | 11/1989 | Japan | |

Primary Examiner—Edward P. Westin
Assistant Examiner—Benjamin D. Driscoll
Attorney, Agent, or Firm—Fay, Sharpe, Beall, Fagan, Minnich & McKee

[57] ABSTRACT

A semiconductor integrated circuit device has a plurality of emitter-coupled logic (ECL) gates. Separate power source wiring lines are provided for current switch circuits and emitter follower output circuits for the gates. The separate sets of power source wiring lines are respectively coupled to the corresponding external terminals of the semiconductor integrated circuit device. The power source wiring lines for each set are arranged adjacent one another on a semiconductor chip in order that they may be short circuited or kept separated depending upon the package structure of the semiconductor integrated circuit device.

49 Claims, 7 Drawing Sheets

SEMICONDUCTOR INTEGRATED CIRCUIT DEVICE HAVING SEPARATE SUPPLY VOLTAGES FOR THE LOGIC STAGE AND OUTPUT STAGE

BACKGROUND OF THE INVENTION

The present invention relates to a feeding system in a semiconductor integrated circuit device. More particularly, it relates to techniques which are effective when utilized for the feeding system of an integrated logic circuit employing emitter-coupled logic (ECL).

One form of semiconductor integrated circuit device is a semiconductor logic circuit wherein emitter-coupled logic (ECL) circuits are employed as gate circuits. By way of example, each of the ECL circuits includes a current switch circuit and an emitter follower circuit. The current switch circuit includes at least one input bipolar transistor which receives an input signal at its base, a bipolar transistor for reference whose emitter is coupled to the emitter of the input bipolar transistor and which receives a reference potential $V_{BB}$ at its base, a first load resistance which is interposed between the collector of the input bipolar transistor and a first supply voltage (Vcc) wiring line, a second load resistance which is interposed between the collector of the reference bipolar transistor and the supply voltage (Vcc) wiring line, and a current source which is interposed between the common emitters of the input and reference bipolar transistors and a second supply voltage (Vee) wiring line. On the other hand, the emitter follower circuit includes an emitter follower bipolar transistor whose base is coupled to the common node of the first load resistance and the collector of the input bipolar transistor, whose collector is coupled to the first supply voltage (Vcc) wiring line, and whose emitter is coupled to an output terminal and is also coupled to the second supply voltage (Vee) wiring line through an emitter resistance.

Japanese Patent Application Laid-Open No. 280348/1989 discloses a technique in a semiconductor memory circuit device having an ECL output circuit, according to which the supply voltage feed line of the emitter follower type output circuit portion of the ECL output circuit and the supply voltage feed line of an active circuit (current switch) forming the preceding stage of this output circuit portion are connected by a low impedance within a chip, thereby to prevent the output circuit portion from oscillating due to the inductance component of a lead terminal.

Before the present invention, the inventors made a study on the prevention of the malfunctions of the ECL circuit attributed to power source noise. As a result, it has been found out that a technique to be stated below is effective.

The current switch circuit is regarded as causing current produced from the current source, to flow from the first supply voltage wiring line to the second supply voltage wiring line steadily during its operation. On the other hand, the emitter follower circuit sends a great current from the first supply voltage wiring line to the output terminal (internal output terminal) of the ECL circuit when the output terminal is set at a high level. At this time, a potential level on the first supply voltage wiring line fluctuates because a parasitic inductance not being negligible is existent in the first supply voltage wiring line. Thus, when the fluctuation of the voltage level is transmitted to the current switch circuit through the first supply voltage wiring line, it degrades an A.C. noise margin for the input signal of the current switch circuit. Therefore, the inventors have developed the technique in which a first supply voltage wiring line for the current switch circuit and a first supply voltage wiring line for the emitter follower circuit are separately laid within the semiconductor chip, whereby the fluctuation of the voltage level (the power source noise) based on the operation of the emitter follower circuit is made less liable to be transmitted to the current switch circuit. In this case, the semiconductor chip is provided thereon with a first power source pad for feeding the first supply voltage (Vcc) to the first supply voltage wiring line of the current switch circuit, and a second power source pad for feeding the first supply voltage (Vcc) to the first supply voltage wiring line of the emitter follower circuit.

SUMMARY OF THE INVENTION

The inventors have found out that the following problem arises even in the case of adopting the power source wiring separating technique as stated above:

The power source noise is correlative with the structure of the package of a semiconductor integrated circuit device and a structure for mounting the chip of the circuit device on a printed circuit board. It has been revealed that, unless a package structure and a mounting structure are considered, an effective measure against the power source noise cannot be taken.

An object of the present invention is to provide a supply voltage feeding system in which the structure of a package and a structure for mounting a semiconductor chip on a printed circuit board (a mounting circuit board) are taken into consideration.

Another object of the present invention is to provide a method of laying out the power source wiring lines of a semiconductor integrated circuit to which a supply voltage feeding system is applicable.

The above and other objects and novel features of the present invention will become apparent from the description of this specification when read in conjunction with the accompanying drawings.

Typical aspects of performance of the present invention will be summarized below.

In a semiconductor integrated circuit device which includes, for example, ECL circuits as gate circuits, a first supply voltage wiring line (11a) for the current switch circuits of the ECL circuits within the semiconductor chip of the circuit device and a first supply voltage wiring line (11b) for the emitter follower circuits of the ECL circuits are connected or are kept separated by the use of low impedance means within the semiconductor chip, in consideration of the structure of a package and a structure for mounting the chip on a printed circuit board.

Concretely, the connection and the disconnection (separation) between the wiring line (11a) for the current switch circuits and the wiring line (11b) for the emitter follower circuits are determined as follows: Symbol L0 denotes the parasitic inductance of a first supply voltage (Vcc) feed line X on the printed circuit board (mounting circuit board), and symbols L1 and L2 denote the parasitic inductances of respective sections extending from the wiring lines (11a) and (11b) within the semiconductor chip to the first supply voltage (Vcc) feed line X on the printed circuit board. When the parasitic inductance L0 is regarded as being greater than or nearly equal to each of the parasitic inductances L1 and L2, that is, when L0 ≳ L1, L2 holds, the wiring line (11a) for the current switch circuits and the wiring line (11b) for the emitter follower circuits should desirably be coupled by the low impedance means Zf within the semiconductor chip. In contrast, when the parasitic inductance L0 is regarded as being smaller than each of the parasitic inductances L1 and L2, that is, when L0<L1, L2 holds, the wiring line (11a) for the current switch circuits and the wiring line (11b) for the emitter follower circuits are separated within the semiconductor chip.

The value of each of the parasitic inductances L1 and L2 varies depending upon the package structure and the mounting structure. More specifically, in a case where the semiconductor chip is encapsulated in a package with lead terminals, for example, a dual in-line package (DIL) or a pin grid array (PGA), each of the parasitic inductances L1 and L2 consists of the parasitic inductance(s) of a piece of bonding wire or/and a lead terminal, and the value thereof is in the tens of nH. On the other hand, in a case where the method of so-called controlled collapse bonding (CCB) is adopted in which the semiconductor chip has solder bump electrodes attached thereto and is directly mounted on the printed circuit board, or in a case where the semiconductor chip having solder bump electrodes is encapsulated in a chip carrier, the parasitic inductance of the solder bump electrode is deemed to form each of the parasitic inductances L1 and L2, and the value thereof becomes several nH.

Meanwhile, a wiring layout on the semiconductor chip is contrived so that the wiring line (11a) and the wiring line (11b) may be connected by the low impedance with ease.

According to the above expedients, in the case where the value of the parasitic inductance L0 is greater than that of each of the parasitic inductances L1 and L2, the wiring line (11a) and the wiring line (11b) within the semiconductor chip are electrically coupled by the low impedance means (Zf) in the semiconductor chip, and hence, power source noise (a potential fluctuation) having developed on the wiring line (11b) is transmitted to the wiring line (11a) through the low impedance means. On this occasion, however, potential fluctuations on the wiring lines (11b) and (11a) are in an inphase mode (common mode), and they converge on the first power source potential (Vcc) gradually as shown in FIG. 8(b), so that the A.C. noise margin of the internal circuit (ICC) is widened. In contrast, when the wiring line (11a) and the wiring line (11b) are not coupled by the low impedance means (Zf), the potential fluctuation on the wiring line (11b) leaks to the first supply voltage feed line (X) on the printed circuit board. Subsequently, a potential fluctuation on the feed line (X) is transmitted to the wiring line (11a) for the reasons that the value of the parasitic inductance L0 is great and that the value of the parasitic inductance L1 is small. Thereafter, the potential fluctuation having leaked to the feed line (X) is fed back onto the wiring line (11b), or the potential fluctuation transmitted onto the wiring line (11a) is fed back to the wiring line (11b) by passing through the parasitic inductance L1, feed line (X) and parasitic inductance L2 again. Accordingly, when the potential fluctuation on the wiring line (11b) and the potential fluctuation fed back to the wiring line (11b) have become a phase difference of just 360°, a resonance phenomenon takes place, and a potential on the wiring line (11b) becomes oscillatory as shown in FIG. 8(a). Likewise, a potential on the wiring line (11a) becomes as shown in FIG. 8(a) when it has exhibited a phase difference of just 360° with respect to the potential fluctuation fed back.

On the other hand, in the case where the value of the parasitic inductance L0 is smaller than that of each of the parasitic inductances L1 and L2, the wiring lines (11a) and (11b) are kept separated or isolated. Accordingly, although the power source noise having developed on the wiring line (11b) leaks onto the printed circuit board, it escapes to the background (Vcc) being a low impedance power source on the printed circuit board for the reason that the value of the parasitic inductance L0 is small. Moreover, the noise having leaked onto the printed circuit board is not transmitted to the wiring line (11a) within the chip for the reason that the value of the parasitic inductance L1 is great.

PREFERRED EMBODIMENTS OF THE INVENTION

Figure 2:
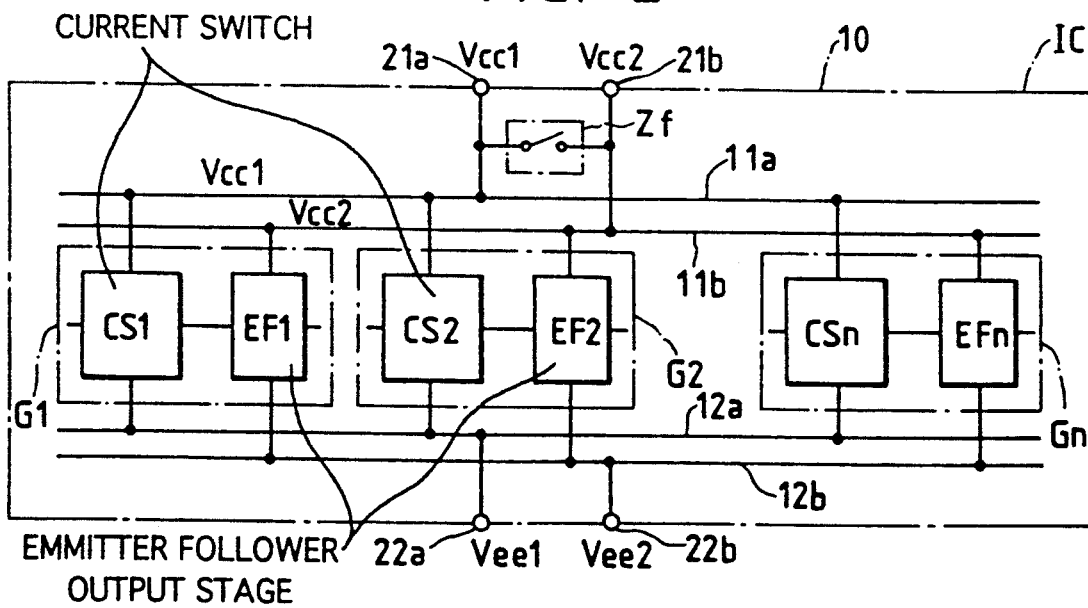
FIG. 2 is a block diagram showing an embodiment in the case of applying the present invention to a semiconductor logic circuit device.

FIG. 2 shows an embodiment in the case of applying the present invention to a semiconductor logic circuit device IC whose internal circuit includes ECL (emitter-coupled logic) gates.

In this embodiment, two power source wiring lines 11a (a first power source wiring line) and 11b (a second power source wiring line) supplied with a first power source potential Vcc such as zero volts, and power source wiring lines 12a and 12b fed with a second power source potential Vee such as −5.2 volts are laid within a semiconductor chip 10 such as of silicon. The ECL gates G1, G2, . . . . , Gn are respectively constituted by current switch circuits CS1, CS2, . . . . , CSn and emitter follower output stages EF1, EF2, . . . . , EFn. Herein, the supply voltage terminals of each of the current switch circuits CS1, CS2, ...., CSn are respectively connected to the power source wiring lines 11a and 12a, while the supply voltage terminals of each of the emitter follower output stages EF1, EF2, ...., EFn are respectively connected to the power source wiring lines 11b and 12b.

Two sets of power source pads 21a-22b are disposed in correspondence with the two sets of separated power source wiring lines 11a-12b. The power source wiring line 11a is connected to the power source pad 21a, the power source wiring line 11b to the power source pad 21b, the power source wiring line 12a to the power source pad 22a, and the power source wiring line 12b to the power source pad 22b.

The power source pads 21a and 21b are respectively supplied with the first supply voltages Vcc of the identical potential such as ground potential (0 V) from first supply voltage (Vcc) feed lines laid on a mounting circuit board. The first supply voltage applied to the power source pad 21a is denoted by Vcc1, while the first supply voltage applied to the power source pad 21b is denoted by Vcc2.

On the other hand, the power source pads 22a and 22b are respectively supplied with the supply voltages Vee of the identical potential such as −5.2 V from second supply voltage feed lines laid on the mounting circuit board. The supply voltage applied to the power source pad 22a is denoted by Vee1, while the supply voltage applied to the power source pad 22b is denoted by Vee2.

In FIG. 2, symbol Zf indicates low impedance means according to the present invention. A switch in the low impedance means Zf is depicted in order to express that the wiring lines 11a and 11b are electrically connected in the closed state of the switch, whereas they are electrically separated or isolated in the open state of the switch. The low impedance means Zf will be described in detail later.

Figure 1:
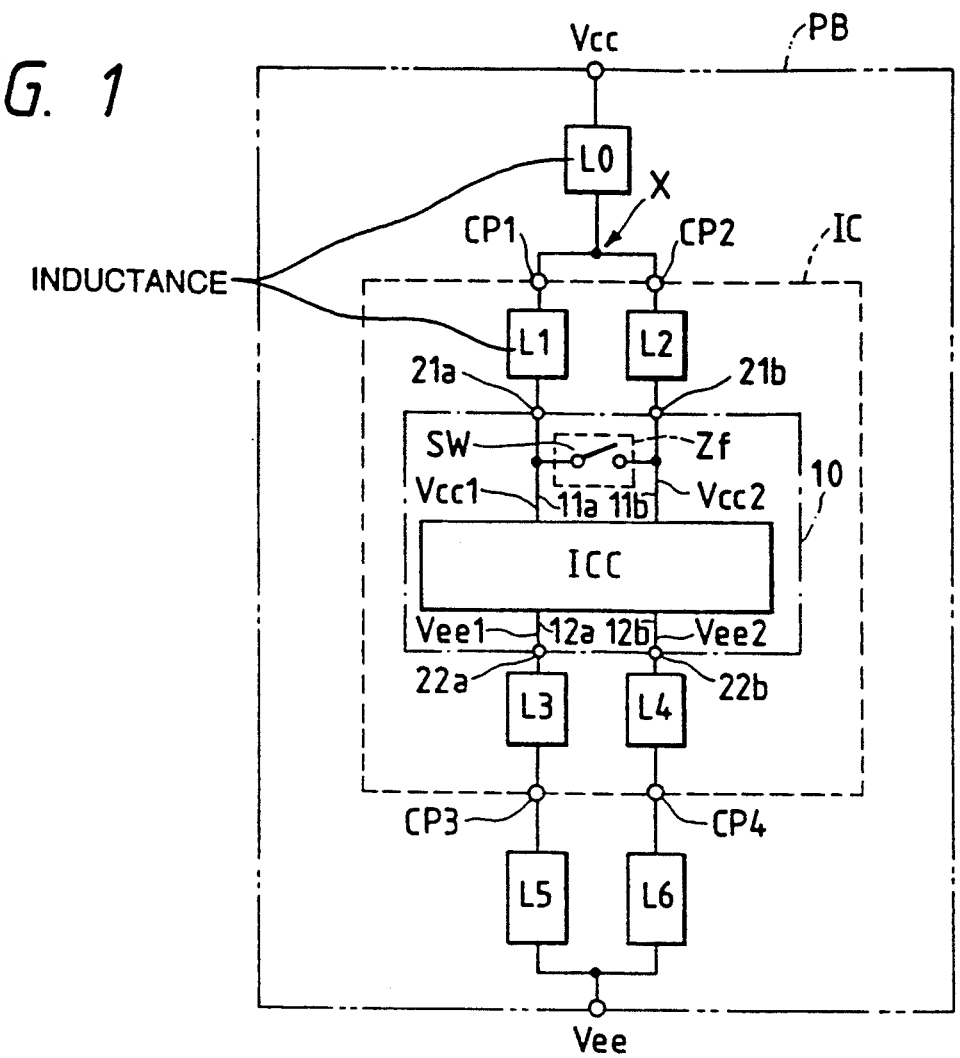
FIG. 1 is a schematic circuit diagram showing the concept of a feeding system according to the present invention.

FIG. 1 shows a schematic diagram of parasitic inductances within the semiconductor logic circuit device IC illustrated in FIG. 2 and parasitic inductances in the mounting circuit board. By the way, in FIG. 1, input signal paths to and output signal paths from the semiconductor logic circuit device IC, etc. are omitted from illustration in order to avoid the complicacy of the drawing. In actuality, the semiconductor logic circuit device IC includes external input terminals to which input signals are applied, input circuits which receive the input signals from the external input terminals, output circuits each of which receives output signals from a plurality of ones of the gate circuits G1-Gn, and output terminals which receive output signals from the output circuits. Further, although only one semiconductor logic circuit device IC is depicted in FIG. 1 in order to avoid the complicacy of the drawing, several tens of ICs are actually mounted on one printed circuit board PB. Besides, the same symbols as in FIG. 1 denote the same components and quantities. In FIG. 1, however, the ECL gates G1-Gn in FIG. 2 are collectively denoted as an internal circuit ICC.

As seen from FIG. 1, the parasitic inductances mentioned below are deemed to exist in case of electrically connecting the printed circuit board PB indicated by a two-dot chain line and the semiconductor chip 10 indicated by a broken line. More specifically, the parasitic inductances L1, L2, L3 and L4 are parasitic to the respective wiring paths between the pads 21a, 21b, 22a and 22b on the semiconductor chip 10 and connection points CP1, CP2, CP3 and CP4 on the printed circuit board PB. The connection points CP1, CP2, CP3 and CP4 may well be regarded as the external power source terminals of the semiconductor logic circuit IC. In addition, the parasitic inductance L0 is parasitic to the wiring path between the first power source terminal Vcc of the printed circuit board PB and the connection points CP1 and CP2 on the printed circuit board PB. Further, the parasitic inductances L5 and L6 are parasitic to the respective wiring paths between the connection points CP3 and CP4 on the printed circuit board PB and the second power source terminal Vee of the printed circuit board PB.

Figure 9:
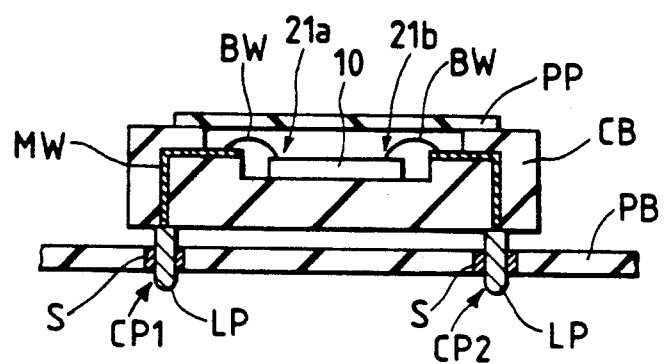
FIGS. 9 and 10 are model diagrams each showing a package structure and a mounting structure.
Figure 10:
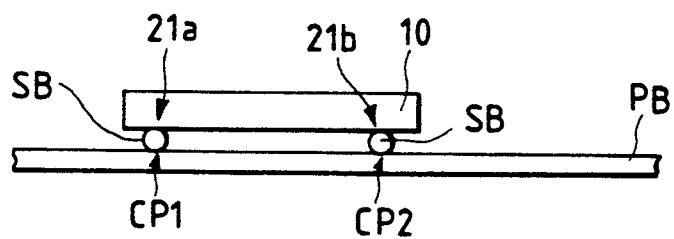

A matter important here is that the values of the parasitic inductances L1 thru L4 vary within a range of, for example, 1 nH to 15 nH, depending upon the structure of a package and the mounting structure of the chip 10. More specifically, in a case where, as shown in FIG. 9 by way of example, the chip 10 is fixed in a ceramic base CB and is encapsulated with a cap PP, each of the power source pads 21a and 21b on the chip 10 is connected with the printed circuit board PB by a piece of metallic bonding wire BW, a metal wiring line MW laid in the ceramic base CB, a lead pin (external terminal) LP and a solder part S. Accordingly, the parasitic inductances of the bonding wire piece BW, metal wiring line MW, lead pin LP and solder part S exist between each of the power source pads 21a, 21b on the chip 10 and the corresponding one of the connection points CP1, CP2 on the printed circuit board PB. Therefore, the value of each of the parasitic inductances L1, L2 becomes, for example, 15 nH or so. On the other hand, in a case where, as shown in FIG. 10 by way of example, the so-called CCB method is adopted in which the chip 10 is directly mounted on the printed circuit board PB by semiconductor bumps SB, or in a case where the chip 10 having solder bump electrodes SB is encapsulated in a chip carrier of ceramic or the like and where the resultant chip carrier is mounted on the printed circuit board PB, each of the power source pads 21a, 21b on the chip 10 is connected to the corresponding one of the connection points CP1, CP2 on the printed circuit board PB through the solder bump SB. With such a mounting method, accordingly, each of the parasitic inductances L1, L2 consists essentially of the parasitic inductance of the solder bump SB and has a value of 1 nH or so.

As stated above, the difference of the package structure or the mounting structure appears as the difference of the value of each of the parasitic inductances L1, L2 (L3, L4). Incidentally, FIGS. 9 and 10 are typically drawn for better understanding, and it is a matter of course that there are various other aspects of performance. In short, FIG. 9 shows an example of the mounting structure of the semiconductor circuit IC including the bonding wire pieces BW and the lead pins LP. Likewise, FIG. 10 shows an example of the mounting structure of the semiconductor circuit IC having the solder bump electrodes SB.

Next, the relations between the low impedance means Zf and power source noise having developed on the power source wiring line 11b will be elucidated as to the parasitic inductances L0, L1 and L2. (1) Case of L0 ≳ L1, L2:

This case is regarded as corresponding to the situation of the mounting structure as shown in FIG. 10. Since the parasitic inductance L0 is not smaller than each of the parasitic inductances L1 and L2, the power source noise having developed on the power source wiring line 11b leaks once to a first supply voltage feed line (indicated by X in FIG. 1) on the printed circuit board PB. However, the noise is fed back to the power source wiring lines 11a and 11b again through the corresponding connection points CP1 and CP2.

Figure 8A:
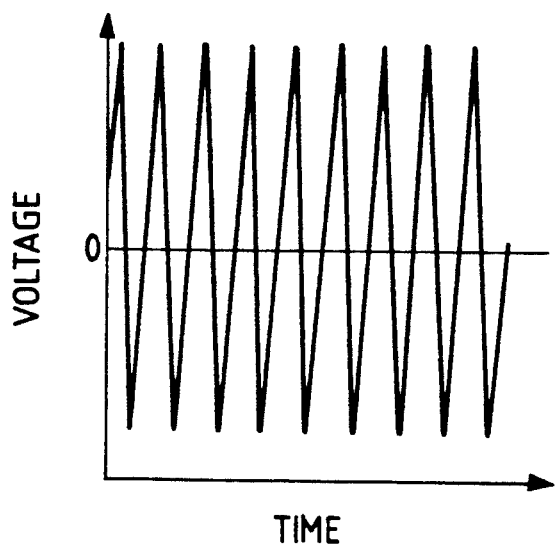
FIG. 8(a) is a waveform diagram showing the resonance state of a supply voltage in a prior-art logic LSI.
Figure 8B:
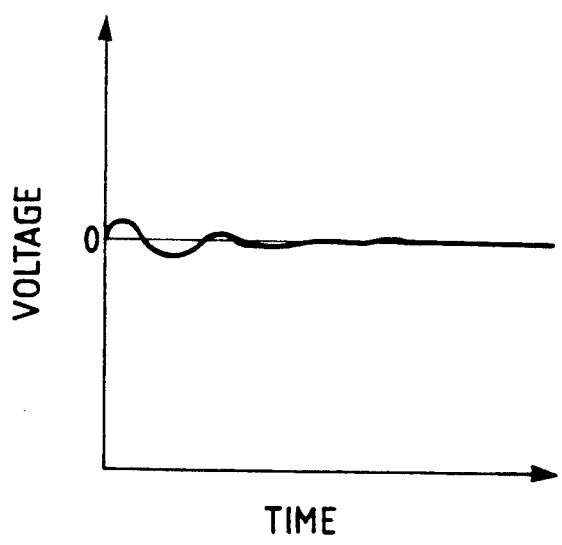
FIG. 8(b) is a waveform diagram showing the situation of the fluctuation of a supply voltage in a logic LSI to which the present invention is applied.

On this occasion, a time difference arises between the power source noise on the wiring line 11b and the power source noise fed back onto the wiring line 11a. Herein, in such a case where the power source noise on the wiring line 11b and the power source noise on the wiring line 11a or 11b exhibit a phase difference of just 360°, both of them become oscillatory as shown in FIG. 8(a). Therefore, the A.C. noise margin of the internal circuit ICC for the input signal thereof degrades. In such a case, accordingly, the wiring lines 11a and 11b are short-circuited within the semiconductor chip 10 by the low impedance means Zf. That is, the switch SW in FIG. 1 is closed. Thus, the time difference between the power source noise on the wiring line 11a and the power source noise on the wiring line 11b lessens though the latter noise is transmitted to the wiring line 11a. As a result, the noises become common mode noises, the amplitudes of which decrease gradually as shown in FIG. 8(b). More specifically, a resonance frequency concerning the wiring lines 11a and 11b is heightened by short-circuiting these wiring lines. In consequence, an energy loss increases, and the amplitudes of the noises converge on an on. Accordingly, the A.C. noise margin of the internal circuit ICC is improved to some extent. (2) Case of L0<L1, L2.

This case is regarded as corresponding to the situation of the backage structure and the mounting structure as shown in FIG. 9 by way of example. Since the value of each of the parasitic inductances L1 and L2 is greater than the value of the parasitic inductance L0, the power source noise having developed on the wiring line 11b leaks onto the printed circuit board PB from this wiring line 11b. However, it escapes to the power source terminal Vcc because the value of the parasitic inductance L0 is small. In addition, the power source noise having developed on the first supply voltage feed line X laid on the printed circuit board PB is not transmitted onto the wiring line 11a or 11b. Accordingly, the A.C. noise margin of the internal circuit ICC is improved, so that the wiring lines 11a and 11b need not be short-circuited by the low impedance means Zf. That is, the switch SW in FIG. 1 is left open, and the wiring lines 11a and 11b are kept electrically separated or isolated.

Figure 3:
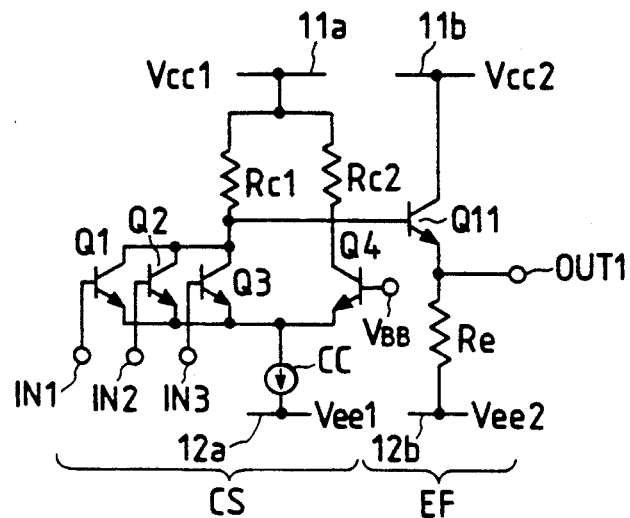
FIG. 3 is a circuit diagram showing an example of an ECL gate which constitutes the semiconductor logic circuit device in FIG. 2.

FIG. 3 is a circuit diagram showing a 3-input NOR logical gate as an example of the ECL gate. The current switch circuit CS of the ECL gate includes three input N-P-N transistors Q1-Q3 and an N-P-N transistor Q4 for reference, the emitters of which are connected in common and then connected to the power source wiring line 12a through a current source CC. The collectors of all the input transistors Q1-Q3 are connected to the power source wiring line 11a through a collector resistance Rc1. The collector of the reference transistor Q4 is connected to the power source wiring line 11a through a collector resistance Rc2. On the other hand, the emitter follower output stage EF of the ECL gate is constituted by an N-P-N bipolar transistor Q11, the collector of which is connected to the power source wiring line 11b and the emitter of which is connected to the power source wiring line 12b through an emitter resistance Re. The base of the transistor Q11 is connected to the common node of the collectors of the input transistors Q1-Q3. Incidentally, the base of the reference transistor Q4 is supplied with a reference potential $V_{BB}$ which is delivered from a reference potential generator circuit not shown. By way of example, the reference potential generator circuit is disposed within the chip 10 in FIG. 2 so as to be coupled between the wiring lines 11a and 12a. This reference potential generator circuit is omitted from illustration in FIG. 2 in order to avoid the complicacy of the drawing.

Figure 4:
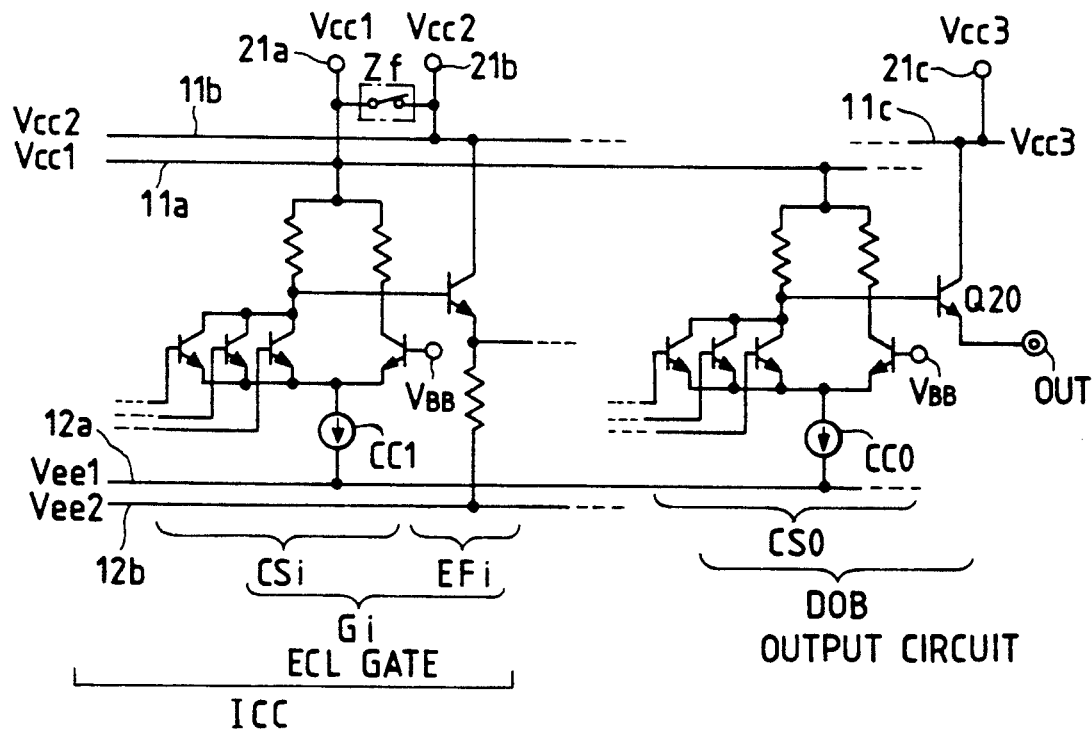
FIG. 4 is a circuit diagram showing the second embodiment of a semiconductor logic circuit device to which the present invention is applied.

FIG. 4 shows the second embodiment of the present invention. In this embodiment, the power source wiring lines of the current switch circuits CSi and emitter follower output stages EFi of the ECL gates Gi of an internal circuit ICC are separated, and besides, the power source wiring lines of the current switch circuit CSO and output N-P-N bipolar transistor Q20 of an output circuit DOB are separated as shown in FIG. 4. Symbol OUT denotes an external output pad.

More specifically, the collector of the output bipolar transistor Q20 is connected to a power source wiring line (a third power source wiring line) 11c which is separated from power source wiring lines (first and second power source wiring lines) 11a and 11b. The power source wiring line 11c is kept separated from the power source wiring lines 11a and 11b even in a case where the wiring lines 11a and 11b are laid so as to be short-circuited by low impedance means Zf as illustrated in the figure. That is, a power source pad 21c is independently provided for the wiring line 11c. Although not especially restricted, the supply voltage terminals of the current switch circuit CSO of the output circuit DOB can be respectively connected in common to the power source wiring lines 11a and 12a of the current switches CS1-CSn of the internal circuit.

In the first embodiment described before, the power source wiring lines separately disposed are short-circuited or kept separated according to the magnitude of the inductance of the common supply voltage feed path, without any distinction between the internal circuit and the output circuit. In this regard, in order to permit the output circuit to drive a load of 50 Ω by way of example, a semiconductor integrated circuit device is so designed that a current being at least 10 times as great as the output current of the gate of the internal circuit is caused to flow to the output pad OUT via the output transistor of the output circuit. In the semiconductor integrated circuit device designed so that the considerably great current may flow through the emitter-collector path of the output transistor in this manner, power source noise of large magnitude might be generated by a current change having developed in the output circuit. With the common power source wiring lines, the A.C. noise margin of the internal circuit might be degraded by the power source noise having developed in the output circuit.

In contrast, in the second embodiment, even when the power source wiring lines 11a and 11b are short-circuited, the power source wiring line 11c of the output transistor Q20 in the output circuit DOB is kept separated. Therefore, this embodiment has the advantage that the internal circuit ICC is not apprehended to erroneously operate due to the power source noise attendant upon the current change in the output circuit DOB.

Figure 5:
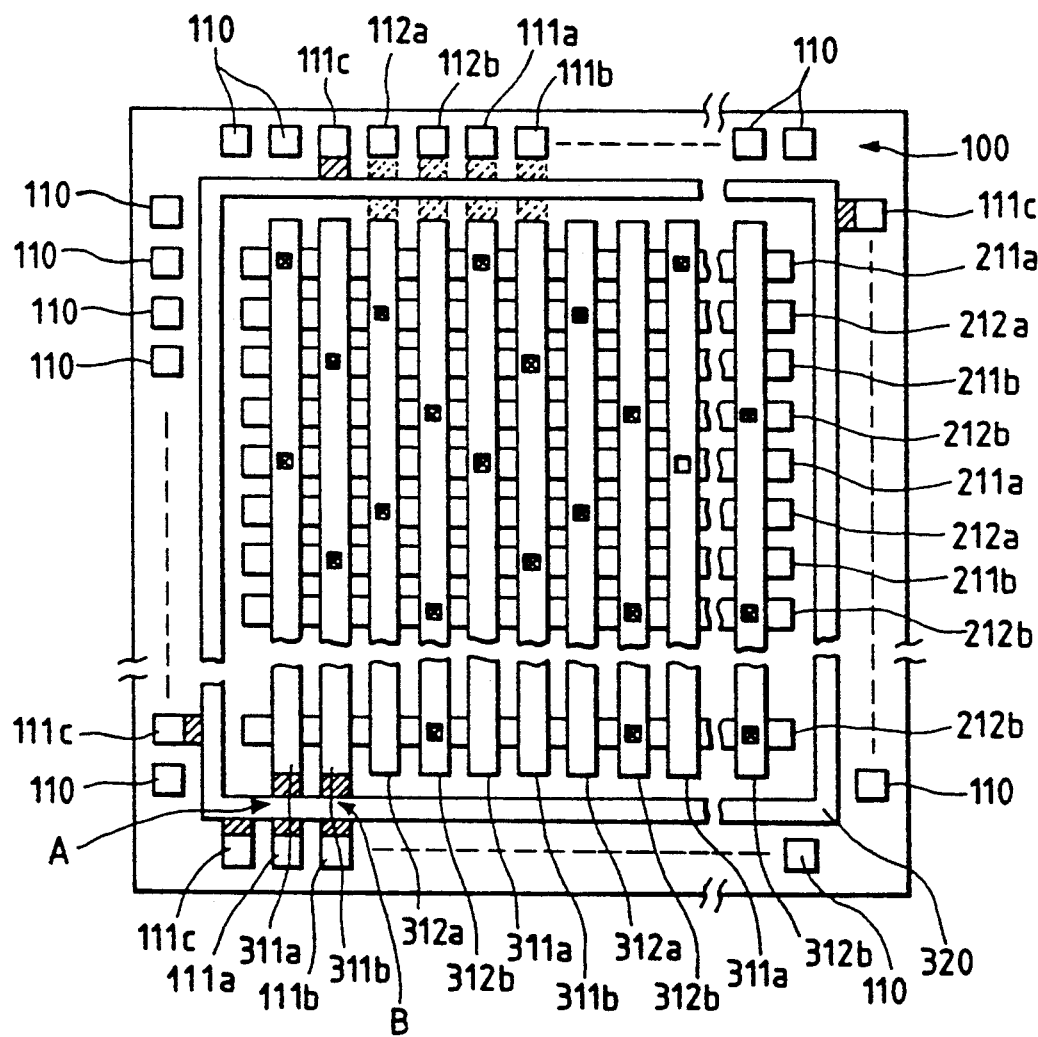
FIG. 5 is a plan view showing an example of the wiring pattern of the semiconductor logic circuit device to which the present invention is applied.

FIG. 5 shows an example of the layout of power source wiring lines in a logic LSI to which the embodiment in FIG. 4 is applied.

Referring to FIG. 5, symbols 311a and 211a denote wiring patterns for feeding a supply voltage Vcc1, which corresponds to the wiring line 11a in FIG. 4. Symbols 311b and 211b denote wiring patterns for feeding a supply voltage Vcc2, which correspond to the wiring line 11b in FIG. 4. Symbols 312a and 212a denote wiring patterns for feeding a supply voltage Vee1, which correspond to a wiring line 12a in FIG. 4. Finally, symbols 312b and 212b denote wiring patterns for feeding a supply voltage Vee2, which correspond to a wiring line 12b in FIG. 4.

Among the wiring patterns, those 311a 311b, 312a and 312b are formed of a third aluminum layer, and those 211a, 211b, 212a and 212b are formed of a second aluminum layer. As seen from FIG. 5, the third-layer aluminum layer. As seen from FIG. 5, the third-layer aluminum wiring lines 311a, 311b, 312a and 312b are laid out so as to cross the second-layer aluminum wiring lines 211a, 211b, 212a and 212b. Incidentally, a first aluminum layer is utilized solely for signal lines which connect circuit elements, namely, bipolar transistors to one another and the bipolar transistor to resistance elements. Needless to say, however, the signal lines may well be formed of the second and third aluminum layers.

A wiring pattern 320 which is formed in the shape of a rectangle inside a pad array 100 disposed so as to surround the wiring patterns 211a–212b and 311a–312b, is a supply voltage line for feeding a supply voltage Vcc3 to the output circuit DOB (corresponding to the wiring line 11c in FIG. 4). This wiring pattern 320 is formed of the third aluminum layer though not especially restricted.

In FIG. 5, a power source pad 111a is fed with the supply voltage Vcc1 from outside a chip, a power source pad 111b with the supply voltage Vcc2, a power source pad 111c with the supply voltage Vcc3, a power source pad 112a with the supply voltage Vee1, and a power source pad 112b with the supply voltage Vee2. The remaining pads 110 are input/output signal pads which are used for inputting/outputting signals. As shown in the figure, the power source pads 111a, 111b, 111c, 112a and 112b are respectively coupled to the power source wiring lines 311a, 311b, 311c, 312a and 312b by hatched aluminum wiring lines.

Figure 6:
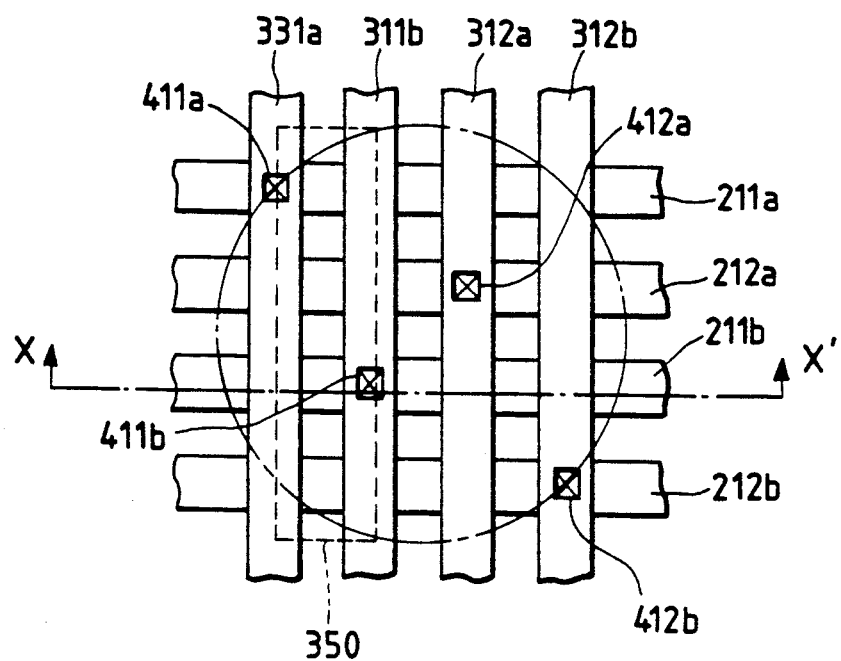
FIG. 6 is an enlarged plan view of the essential portions of the exemplified wiring pattern.

As seen from FIG. 5, the Vcc1 line 211a, Vcc2 line 211b, Vee1 line 212a and Vee2 line 212b formed of the second aluminum layer are electrically connected with the Vcc1 line 311a, Vcc2 line 311b, Vee1 line 312a and Vee2 line 312b formed of the third aluminum layer, by through holes 411a, 411b, 412a and 412b depicted on an enlarged scale in FIG. 6, respectively.

Further, in this embodiment, the Vcc1 line 311a and Vcc2 line 311b formed of the third aluminum layer are arranged in adjacency to each other. Accordingly, in the case where the inductance of the common supply voltage feed path outside the chip is small, the Vcc1 line 11a and Vcc2 line 11b can be easily short-circuited by forming a shorting pattern 350 between the wiring patterns 311a and 311b as shown in FIG. 6. That is, in this embodiment, the shorting pattern 350 is employed as the low impedance means Zf. Such shorting patterns 350 are formed in the plurality of places of the chip.

The shorting patterns 350 are formed by, for example, a method in which pattern data having information items on the shapes, sizes and positions of the shorting patterns is prepared beforehand, and the prepared data is combined at need with the pattern data of the third-layer aluminum wiring lines constructing the power source lines, thereby to fabricate a single photomask for forming a third-layer aluminum pattern. Alternatively, the shorting patterns 350 may well be formed by a method in which a photomask fabricated on the basis of the original wiring pattern data and a photomask fabricated on the basis of the shorting pattern data are prepared beforehand, and the two steps of a photoresist (exposure) step for forming the wiring lines and a photoresist (exposure) step for forming the shorting patterns are dividedly performed using the respective photomasks when the shorting patterns are needed.

Figure 7:
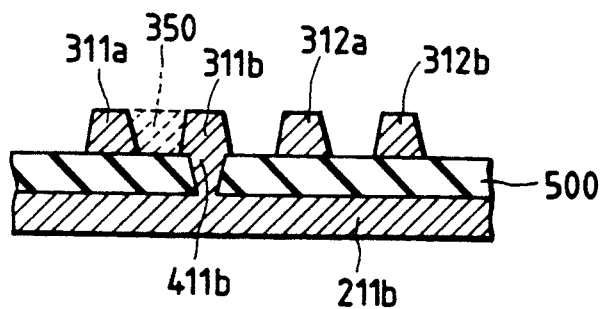
FIG. 7 is a sectional view taken along line X—X' in FIG. 6.

FIG. 7 shows the sectional structure of the second and third aluminum wiring layers taken along line X—X' in FIG. 6.

In the case of adding the shorting pattern 350, the interspace between the wiring pattern 311a of the supply voltage Vcc1 and the wiring pattern 311b of the supply voltage Vcc2 is filled up with an aluminum layer serving as the shorting pattern 350. For this reason, the fluctuation of the supply voltage becomes easily transmitted.

In FIG. 7, numeral 500 designates an interlayer insulator film made of, for example, SiO$_2$.

In the above embodiment, the shorting pattern made of aluminum is employed as the low impedance means Zf for connecting the wiring pattern of the Vcc1 line and that of the Vcc2 line. The aluminum material of the shorting pattern, however, may well be replaced with any of refractory metals such as Ti, W and Mo; low-resistance polycrystalline silicon; any compound between a metal and silicon; or the like.

Although the above embodiment has been exemplified as holding the wiring patterns of the Vcc1 line and Vcc2 line adjacent in the third aluminum layer, the example is not restrictive. That is, the power source wiring patterns Vcc1 and Vcc2 of the identical potential may well be held adjacent in the second aluminum layer or in the second and third aluminum layers, instead of the third aluminum layer. In that case, the shorting patterns can be formed of the aluminum layer of the second layer (lower layer), not of the third aluminum layer as the uppermost layer (upper layer).

Meanwhile, in view of the state of the packaging of a semiconductor integrated circuit device, it is sometimes considered better that the power source wiring line 11c for the output transistor Q20 is electrically short-circuited with the wiring line(s) 11a or/and 11b. In this case, the wiring line 11c is electrically connected with, at least, either of the wiring lines 11a and 11b through a through hole (not shown) or the like at a part indicated by A or B in FIG. 5. Also in this case, the positional information items of the short-circuiting through holes are prepared as pattern data beforehand, and a photomask for the through holes is formed at need by utilizing the pattern data.

Figure 11:
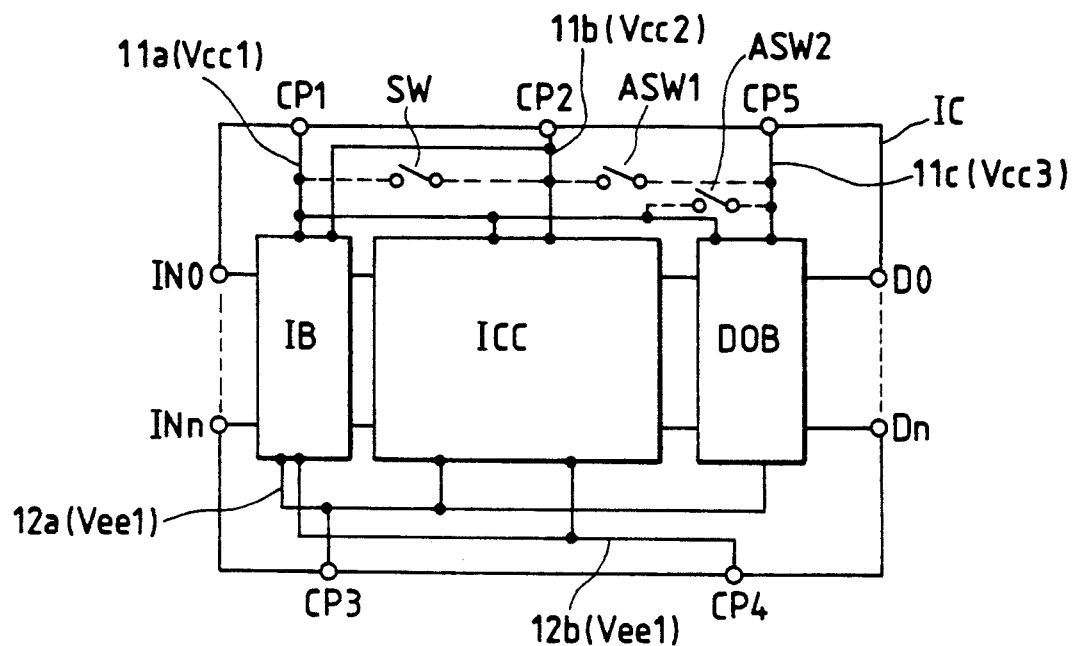
FIG. 11 is a schematic circuit diagram of a semiconductor logic circuit device to which the present invention is applied.

A schematic diagram of a semiconductor logic circuit device IC in the aforementioned case is shown in FIG. 11. Points different from the foregoing embodiments will be chiefly described below.

The semiconductor logic circuit device IC includes input terminals IN0–INn which receive input signals, input circuits IB which are respectively coupled to the input terminals, internal circuits ICC which receive the output signals of the input IB and generate output signals for driving output circuits DOB, respectively, and data output terminal DO-Dn which receive the output signals of the respective output circuits DOB.

This IC is furnished as external power source terminals with first, second and third external terminals CP1, CP2 and CP5 which are respectively fed with supply voltages Vcc1, Vcc2 and Vcc3 such as of 0 V, an external terminal CP3 which is fed with a minus voltage Vee1 such as of −5.2 V, and an external terminal CP4 which is fed with a minus voltage Vee2 such as of −3 V. The supply voltages (Vcc1-Vcc3, Vee1, Vee2) fed to the external terminals CP1-CP5 are fed to the input circuits IB, internal circuits ICC and output circuits DOB as illustrated in the figure.

Power source wiring lines 11a and 11b can be short-circuited by low impedance means Zf as shown in FIGS. 1 and 2 or in FIG. 4. This fact is indicated as a switch SW.

On the other hand, a power source wiring line 11c is adapted to be short-circuited with the power source wiring line(s) 11a or/and 11b as stated before. This fact is indicated as switches ASW1 and ASW2.

Incidentally, the power source wiring lines 11a, 11b and 11c are regarded as being identical to those shown in FIG. 4. Besides, the layout of the power source wiring lines of this IC is regarded as being identical to that shown in FIG. 5.

The switches ASW1, ASW2 thus added and the switch SW are opened or closed as may be needed, in other words, according to the packaging state of the IC. As understood from the foregoing, the closed states of the switches SW, ASW1 and ASW2 signify that the corresponding wiring lines (11a-11b, 11a-11b-11c, and 11a-11c or 11b-11c) are short-circuited by the low impedance means made of aluminum or the like.

The layout of the power source wiring lines as shown in FIG. 5 is adopted in order that such switches SW, ASW1 and ASW2 may be brought into the closed states at need.

As described above, in a semiconductor integrated circuit device whose supply voltage feed paths of identical potential are made common in a packaging system, each of the foregoing embodiments consists in that power source wiring lines of identical potentials are separated in correspondence with circuits of stable current and circuits of great current change and that the power source wiring lines are disposed so as to adjoin each other within, at least, parts of a semiconductor chip. Further, in a case where the inductance L0 of the common power source wiring line of the packaging system is sufficiently great as compared with each of the inductances L1, L2 of the internal power source wiring lines, these internal power source wiring lines are left separated. In contrast, in a case where the inductance L0 of the supply voltage feed path of the packaging system is relatively small as compared with each of the inductances L1, L2 of the internal power source wiring lines, the separated power source wiring lines within the chip are short-circuited to each other by low impedance means Zf such as an aluminum pattern, at the adjacent parts thereof.

In this manner, when the inductance L0 of the common supply voltage feed path is great, the power source wiring lines within the chip are kept separated, and hence, the influence of the supply voltage fluctuation of the power source wiring line of great current change on the power source wiring line of small current change can be relieved. In contrast, when the inductance L0 of the common supply voltage feed path of the packaging system is small, the power source wiring lines within the chip are short-circuited to each other. Therefore, although the influence of the supply voltage fluctuation of the power source wiring line having great current change on the power source wiring line having only a small current change cannot be relieved, the time difference between the noises on the respective power source wiring lines can be eliminated to prevent a resonance phenomenon ascribable to the transmission of the internal current change to the exterior of the chip and to the return thereof into the chip. In this manner, convergence of the supply voltage fluctuation can be quickened as shown in FIG. 8(b). This brings forth the effect that the A.C. noise margin of the whole logic LSI can be widened.

Although, in the above, the invention made by the inventors has been concretely described in conjunction with embodiments, it is needless to say that the present invention is not restricted to the foregoing embodiments, but that is can be variously altered within a scope not departing from the purport thereof. By way of example, the embodiments have been described as to a measure against power source noise taken by noticing the inductance of a supply voltage feed path on the side of a supply voltage Vcc, but a similar measure to counter noise may well be taken also on the side of a supply voltage Vee. In the case of a semiconductor circuit device in each embodiment, however, the supply voltage Vcc is the ground potential, so that the levels of signals, etc. are determined using the voltage Vcc as a reference potential at the stage of design. Moreover, within the semiconductor chip, when the potential of the Vee side fluctuates, the signal levels often follow up the fluctuation, so that the fluctuation of the supply voltage Vee does not lead to the degradation of the margin considerably. It is accordingly effective to apply the present invention to, at least, the Vcc side serving as the reference potential.

Figure 12:
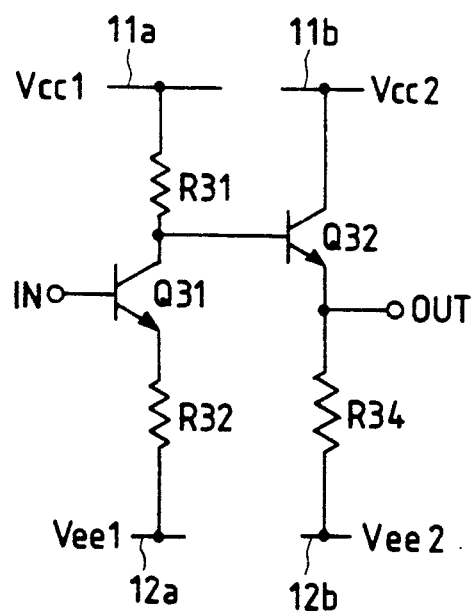
FIG. 12 is a circuit diagram showing an example of an NTL circuit.

In the above, the invention made by the inventors has been principally described as to the case of applying it to a logic LSI which includes ECL gates as basic logic circuits and which forms the background field of utilization. However, the present invention is not restricted to the logic LSI, but it can be extensively applied to semiconductor logic circuit devices each of which includes bipolar transistor logical gates such as NTL (non-threshold logic) gates or TTL (transistor-transistor logic) gates, CMOS logical gates, or Bi-CMOS logical gates. Especially, the NTL gates can be utilized as some of the gates of the internal circuit ICC in FIGS. 1 and 2, FIG. 4 and FIG. 11. As shown in FIG. 12, the NTL gate is constructed including an input N-P-N transistor Q31 which receives an input signal "in" at its base, a resistance R31 which is interposed between the collector of the transistor Q31 and a wiring line 11a, a resistance R32 which is interposed between the emitter of the transistor Q31 and a wiring line 12a, an emitter-follower output N-P-N bipolar transistor Q31 whose collector is coupled to a wiring line 11b, whose base is coupled to the collector of the transistor Q31 and whose emitter is coupled to an output terminal "out", and a resistance R34 which is interposed between the emitter of the transistor Q32 and a wiring line 12b. Since the NTL gate itself is well known to those skilled in the art, the operation thereof shall be omitted from description.

An effect which is attained by a typical aspect of performance of the present invention is briefly explained as follows:

In a semiconductor integrated circuit device whose supply voltage feed paths of identical potential are made common in a packaging system, the fluctuation of a supply voltage attendant upon a current change within the circuit is effectively suppressed in accordance with a packaging form, and the A.C. noise margin of the circuit can be widened.

What is claimed is:

1. A semiconductor integrated circuit device comprising:

a first-supply-voltage feed external terminal to be fed with a first supply voltage from outside of said semiconductor integrated circuit device;

a second-supply-voltage feed external terminal to be fed with a second supply voltage from outside of said semiconductor integrated circuit device, said second supply voltage being substantially identical in potential to said first supply voltage;

a semiconductor substrate having a main surface;

a plurality of wiring layers each of which comprises a first wiring line being electrically coupled to receive said first supply voltage and a second wiring line being electrically coupled to receive said second supply voltage, the first wiring line and the second wiring line in a predetermined one of said plurality of wiring layers being paired with and in adjacency to each other; and a plurality of logic circuits formed on said main surface, each of said plurality of logic circuits including:

first and second load elements, an input bipolar transistor which has a collector coupled to said first load element, a base to be supplied with an input signal, and an emitter, a reference bipolar transistor which has a collector coupled to said second load element, a base to be supplied with a reference potential, and an emitter coupled to said emitter of said input bipolar transistor, a current source which is coupled to a common node of said emitter of said input bipolar transistor and said emitter of said reference bipolar transistor, an emitter-follower output bipolar transistor which has a collector, an emitter, and a base coupled to a common node of said first load element and collector of said input bipolar transistor, a first terminal to be fed with said first supply voltage via the first wiring lines, said first terminal being electrically coupled to said collectors of said input and reference bipolar transistors through said first and second load elements, and a second terminal to be fed with said second supply voltage via the second wiring lines, said second terminal being electrically coupled to said collector of said emitter-follower output bipolar transistor.

2. A semiconductor integrated circuit device according to claim 1, wherein each of said logic circuits further comprises a second input bipolar transistor having a collector-emitter path coupled to parallel with said collector-emitter path of said first input bipolar transistor and a base to be supplied with another input signal.

3. A semiconductor integrated circuit device according to claim 1, further comprising a third-supply-voltage feed external terminal to be fed with a third supply voltage from outside of said semiconductor integrated circuit device, said third supply voltage being different from both said first voltage and said second voltage, wherein each of said plurality of wiring layers further comprises a third wiring line being electrically coupled to receive said third supply voltage.

4. A semiconductor integrated circuit device according to claim 1, wherein said predetermined wiring layer is an uppermost layer.

5. A semiconductor integrated circuit device according to claim 1, wherein said first wiring lines and said second wiring lines, and said short-circuit means are respectively made of aluminum.

6. A semiconductor integrated circuit device according to claim 1, wherein said plurality of wiring layers consists of two wiring layers having an upper layer and a lower layer, and wherein said upper layer is said uppermost layer and said predetermined wiring layer.

7. A semiconductor integrated circuit device according to claim 1, wherein said predetermined wiring layer further comprises a plurality of pairs of said first wiring lines and said second wiring lines.

8. A semiconductor integrated circuit according to claim 7, further comprising a third-supply-voltage feed external terminal to be fed with a third supply voltage from outside of said semiconductor integrated circuit device, said third supply voltage being different from said first and second supply voltages, respectively, wherein each of said plurality of wiring layers further comprises third wiring lines each being electrically coupled to receive said third supply voltage, each of said third wiring lines being formed between said pairs of said first and second wiring lines.

9. A semiconductor integrated circuit device according to claim 1, wherein all of said first wiring lines of said plurality of wiring layers are electrically coupled together, all of said second wiring lines of said plurality of wiring layers are electrically coupled together, and wherein said semiconductor circuit device is encapsulated in a package furnished with a plurality of lead pins, at least one of said lead pins is electrically coupled to the first wiring line of an uppermost layer in said plurality of wiring layers via said first-supply-voltage feed external terminal, and at least one of said lead pins is electrically connected to the second wiring line of said uppermost layer via said second-supply-voltage feed external terminal.

10. A semiconductor integrated circuit device according to claim 9, wherein said predetermined wiring layer is an uppermost layer.

11. A semiconductor integrated circuit device according to claim 9, wherein said package is mounted on a circuit board being arranged outside of said package including said semiconductor integrated circuit device, and wherein said lead pins are connected to said circuit board.

12. A semiconductor integrated circuit device according to claim 11, wherein each of said lead pins has a parasitic inductance having a first value, and wherein said circuit board being coupled to said lead pins has a parasitic inductance having a second value smaller than said first value.

13. A semiconductor integrated circuit device according to claim 1,
wherein all of said first wiring lines of said plurality of wiring layers are electrically coupled together, all of said second wiring lines of said plurality of wiring layers are electrically coupled together; and
wherein said semiconductor integrated circuit device is encapsulated in a package having a plurality of bump electrodes, at least one of said bump electrodes is electrically coupled to the first wiring line of an uppermost layer of said plurality of wiring layers via said first-supply-voltage feed external terminal, and at least one of said bump electrodes is electrically coupled to the second wiring line of an uppermost layer via said second-supply-voltage feed external terminal
wherein said paired first and second wiring lines in said predetermined one of said plurality of wiring layers are coupled to each other.

14. A semiconductor integrated circuit device according to claim 13,
wherein said package is mounted on a circuit board being arranged outside of said package including said semiconductor integrated circuit device, and
wherein said bump electrodes are electrically coupled to said circuit board.

15. A semiconductor integrated circuit device according to claim 14,
wherein each of said bump electrodes has a parasitic inductance having a first value, and
wherein said circuit board being coupled to said bump electrodes has a parasitic inductance having a second value equal to or larger than said first value.

16. A semiconductor integrated circuit device according to claim 13,
wherein said predetermined wiring layer is an uppermost layer.

17. A semiconductor integrated circuit device comprising:
a first-supply-voltage feed external terminal to be fed with a first supply voltage from outside of said semiconductor integrated circuit device;
a second-supply-voltage feed external terminal to be fed with a second supply voltage from outside of said integrated circuit device, said second supply voltage being substantially identical in potential to said first supply voltage;
a third-supply-voltage feed external terminal to be fed with a third supply voltage from outside of said semiconductor integrated circuit device, said third supply voltage being substantially identical in potential to said first supply voltage;
an external output terminal;
a semiconductor substrate having a main surface;
a plurality of wiring layers each of which comprises a first wiring line being electrically coupled to receive said first supply voltage and a second wiring line being electrically coupled to receive said second supply voltage, at least one of said wiring layers further comprising a third wiring line being electrically coupled to receive said third supply voltage, the first wiring line and the second wiring line in a predetermined one of said plurality of wiring layers being paired with and in adjacency to each other;
an output circuit formed on said main surface including
a third terminal to be fed with said third supply voltage,
an output terminal electrically coupled to said external output terminal, and
an output bipolar transistor having an emitter electrically coupled to said output terminal, a collector electrically coupled to said third terminal, and a base; and
a plurality of logic circuits formed on said main surface, each of said plurality of logic circuits including,
first and second load elements,
an input bipolar transistor which has a collector coupled to said first load element, a base to be supplied with an input signal, and an emitter,
a reference bipolar transistor which has a collector coupled to said second load element, a base to be supplied with a reference potential, and an emitter coupled to said emitter of said input bipolar transistor,
a current source which is coupled to a common node of said emitter of said input bipolar transistor and said emitter of said reference bipolar transistor,
an emitter-follower output bipolar transistor which has a collector, an emitter, and a base coupled to a common node of said first load element and said collector of said input bipolar transistor,
a first terminal to be fed with said first supply voltage via the first wiring lines, said first terminal being electrically coupled to said collectors of said input and reference bipolar transistors through said first and second load elements, and
a second terminal to be fed with said second supply voltage via the second wiring lines, said terminal being electrically coupled to said collector of said emitter-follower output bipolar transistor.

18. A semiconductor integrated circuit device according to claim 17,
wherein said predetermined wiring layer further comprises a plurality of pairs of said first wiring lines and said second wiring lines.

19. A semiconductor integrated circuit device according to claim 18, further comprising a third-supply-voltage feed external terminal to be fed with a third supply voltage from outside of said semiconductor integrated circuit device, said third supply voltage being different from both said first and said second supply voltages,
wherein each of said plurality of wiring layers further comprises third wiring lines each being electrically coupled to receive said third supply voltage, each of said third wiring lines being formed between said pairs of said first and second wiring lines.

20. A semiconductor integrated circuit device according to claim 17,
wherein all of said first wiring lines of said plurality of wiring layers are electrically coupled together, all of said second wiring lines of said plurality of wiring layers are electrically coupled together, and
wherein said semiconductor integrated circuit device is encapsulated in a package having a plurality of bump electrodes, at least one of said bump electrodes is electrically coupled to the first wiring line of an uppermost layer of said plurality of wiring layers via said first-supply-voltage feed external terminal, at least one of said bump electrodes is electrically coupled to the second wiring line of an uppermost layer of said plurality of wiring layers via said second-supply-voltage feed external terminal, and at least one of said solder bumps is electrically coupled to the third wiring line of an uppermost layer via said third-supply-voltage feed external terminal, and wherein said paired first and second wiring lines in said predetermined one of said plurality of wiring layers are coupled to each other.

21. A semiconductor integrated circuit device according to claim 20, wherein said package is mounted on a circuit board arranged outside of said package including said semiconductor integrated circuit device, and wherein said bump electrodes are electrically coupled to said circuit board.

22. A semiconductor integrated circuit device according to claim 21, wherein each of said bump electrodes has a parasitic inductance having a first value, and wherein said circuit board coupled to said bump electrodes has a parasitic inductance having a second value equal to or larger than said first value.

23. A semiconductor integrated circuit device according to claim 20, wherein said predetermined wiring layer is an uppermost layer.

24. A semiconductor integrated circuit device according to claim 17, wherein all of said first wiring lines of said plurality of wiring layers are electrically coupled together, all of said second wiring lines of said plurality of wiring layers are electrically coupled together, and wherein said semiconductor integrated circuit device is encapsulated in a package furnished with a plurality of lead pins, at least one of said lead pins is electrically coupled to the first wiring line on an uppermost layer in said plurality of wiring layers via said first-supply-voltage feed external terminal, and at least one of said lead pins is electrically coupled to the second wiring line on said uppermost layer in said plurality of wiring layers via said second-supply-voltage feed external terminal, and at least one of said lead pins is electrically coupled to said third wiring line on an uppermost layer via said third-supply-voltage feed external terminal.

25. A semiconductor integrated circuit device according to claim 24, wherein said package is mounted on a circuit board arranged outside of said package including said semiconductor integrated circuit device, and wherein said lead pins are connected to said circuit board.

26. A semiconductor integrated circuit device according to claim 25, wherein each of said lead pins has a parasitic inductance having a first value, and wherein said circuit board coupled to said lead pins has a parasitic inductance having a second value smaller than said first value.

27. A semiconductor integrated circuit device according to claim 24, wherein said predetermined wiring layer is an uppermost layer.

28. A semiconductor integrated circuit device according to claim 17, wherein said predetermined wiring layer is an uppermost layer.

29. A semiconductor integrated circuit device according to claim 28, wherein said plurality of wiring layers consist of two wiring layers having an upper-layer and a lower-layer, and wherein said upper-layer is said uppermost layer and said predetermined wiring layer.

30. A semiconductor integrated circuit device according to claim 17, wherein said first wiring lines, said second wiring lines, and said short-circuit means and said third wiring line are respectively made of aluminum.

31. A semiconductor integrated circuit device according to claim 17, wherein each of said logic circuits further comprises a first input bipolar transistor having a collector-emitter path coupled in parallel with said collector-emitter path of said input bipolar transistor and a base to be supplied with an another input signal.

32. A semiconductor integrated circuit device according to claim 17, further comprising a third-supply-voltage feed external terminal to be fed with a third supply voltage from outside of said semiconductor integrated circuit device, said third supply voltage being different from both said first and second supply voltages, wherein each of said plurality of wiring layers further comprises a third wiring line being electrically coupled to receive said third supply voltage.

33. A semiconductor integrated circuit device comprising:

a first-supply-voltage feed external terminal to be fed with a first supply voltage from outside of said semiconductor integrated circuit device;

a second-supply-voltage feed external terminal to be fed with a second supply voltage from outside of said semiconductor integrated circuit device, said second supply voltage being substantially identical in potential to said first supply voltage;

a semiconductor substrate having a main surface;

a plurality of wiring layers each of which comprises a first wiring line being electrically coupled to receive said first supply voltage and a second wiring line being electrically coupled to receive said second supply voltage, the first wiring line and second wiring line in a predetermined one of said plurality of wiring layers being paired with and in adjacency to each other; and a plurality of logic circuits formed on said main surface each including a logic stage and an output stage, said logic stage having a first terminal coupled to receive said first supply voltage via the first wiring lines and performing a predetermined logic operation according to an input signal, said output stage coupled to receive an output signal from said logic stage and having a second terminal coupled to receive said second supply voltage via the second wiring lines.

34. A semiconductor integrated circuit device according to claim 33, wherein said predetermined wiring layer further comprises a plurality of pairs of said first wiring lines and said second wiring lines.

35. A semiconductor integrated circuit device according to claim 34, further comprising a third-supply-voltage feed external terminal to be fed with a third supply voltage from outside of said semiconductor integrated circuit device, said third supply voltage being different from both said first and said second supply voltages, wherein each of said plurality of wiring layers further comprises third wiring lines each being electrically coupled to receive said third supply voltage, each of said third wiring lines being formed between said pairs of said first and second wiring lines.

36. A semiconductor integrated circuit device according to claim 33, wherein each of said logic circuits further comprises a fist input bipolar transistor having a collector-emitter path coupled in parallel with said collector-emitter path of said input bipolar transistor and a base to be supplied with an another input signal.

37. A semiconductor integrated circuit device according to claim 33, wherein said first wiring lines and said second wiring lines, and said short-circuit means are respectively made of aluminum.

38. A semiconductor integrated circuit device according to claim 33,
wherein said each logic stage includes:
first and second load elements,
an input bipolar transistor which has a collector coupled to said first load element, a base to be supplied with an input signal, and an emitter,
a reference bipolar transistor which has a collector coupled to said second load element, a base to be supplied with a reference potential, and an emitter coupled to said emitter of said input bipolar transistor, and
a current source which is coupled to a common node of said emitter of said input bipolar transistor and said emitter of said reference bipolar transistor,
wherein said each output stage includes:
an emitter-follower output bipolar transistor which has a collector, an emitter, and a base coupled to a common node of said first load element and said collector of said input bipolar transistor,
wherein said first terminal is electrically coupled to said collectors of said input and reference bipolar transistors through said first and second load elements, and
wherein said second terminal is electrically coupled to said collector of said emitter-follower output bipolar transistor.

39. A semiconductor integrated circuit device according to claim 33,
wherein all of said first wiring lines of said plurality of wiring layers are electrically coupled together, all of said second wiring lines of said plurality of wiring layers are electrically coupled together, and
wherein said semiconductor circuit device is encapsulated in a package furnished with a plurality of lead pins, at least one of said lead pins is electrically coupled to the first wiring line of an uppermost layer in said plurality of wiring layers via said first-supply-voltage feed external terminal and at least one of said lead pins is electrically coupled to the second wiring line of said uppermost layer via said second-supply-voltage feed external terminal.

40. A semiconductor integrated circuit device according to claim 39, wherein said package is mounted on a circuit board arranged outside of said package including said semiconductor integrated circuit device, and
wherein said lead pins are connected to said circuit board.

41. A semiconductor integrated circuit device according to claim 40, wherein each of said lead pins has a parasitic inductance having a first value, and
wherein said circuit board being coupled to said lead pins has a parasitic inductance having a second value smaller than said first value.

42. A semiconductor integrated circuit device according to claim 39, wherein said predetermined wiring layer is an uppermost layer.

43. A semiconductor integrated circuit device according to claim 33, wherein said predetermined wiring layer is an uppermost layer.

44. A semiconductor integrated circuit device according to claim 43, wherein said plurality of wiring layers consists of two wiring layers having an upper-layer and a lower-layer, and
wherein said upper-layer is said uppermost layer and said predetermined wiring layer.

45. A semiconductor integrated circuit device according to claim 33,
wherein all of said first wiring lines of said plurality of wiring layers are electrically coupled together, all of said second wiring lines of said plurality of wiring layers are electrically coupled together, and
wherein said semiconductor integrated circuit device is encapsulated in a package having a plurality of bump electrodes, at least one of said bump electrodes is electrically coupled to the first wiring line of an uppermost layer of said plurality of wiring layers via said first-supply-voltage feed external terminal, at least one of said bump electrodes is electrically coupled to the second wiring line of an uppermost layer of said plurality of wiring layers via said second-supply-voltage feed external terminal, and further wherein said paired first and second wiring lines in said predetermined one of said plurality of wiring layers are coupled to each other.

46. A semiconductor integrated circuit device according to claim 45, wherein said package is mounted on a circuit board arranged outside of said package including said semiconductor integrated circuit device, and
wherein said bump electrodes are electrically coupled to said circuit board.

47. A semiconductor integrated circuit device according to claim 46, wherein each of said bump electrodes has a parasitic inductance having a first value, and
wherein said circuit board coupled to said bump electrodes has a parasitic inductance having a second value equal to or larger than said first value.

48. A semiconductor integrated circuit device according to claim 45, wherein said predetermined wiring layer is an uppermost layer.

49. A semiconductor integrated circuit device according to claim 33, further comprising a third-supply-voltage feed external terminal to be fed with a third supply voltage from outside of said semiconductor integrated circuit device, said third supply voltage being different from both said first voltage and said second voltage,
wherein each of said plurality of wiring layers further comprises a third wiring line being electrically coupled to receive said third supply voltage.

* * * * *